United States Patent [19]

Findeisen

[11] 4,315,220

[45] Feb. 9, 1982

[54] PEAK DETECTOR CIRCUIT

[75] Inventor: Heinz H. Findeisen, Milford, Mass.

[73] Assignee: Digital Equipment Corporation, Maynard, Mass.

[21] Appl. No.: 51,964

[22] Filed: Jun. 25, 1979

[51] Int. Cl.$^3$ ........................................... H03K 5/153
[52] U.S. Cl. .................................. 328/150; 307/351; 307/562; 307/565; 307/261; 324/103 P; 328/171
[58] Field of Search .............. 307/351, 354, 237, 261; 328/114, 132, 128, 150, 171, 175, 145; 324/103 P

[56] References Cited

U.S. PATENT DOCUMENTS 3,048,717 8/1962 Jenkins ............................ 307/351 X
3,805,170 4/1974 Dusheck, Jr. .................... 328/132 X
3,895,237 7/1975 Harr .................................. 307/351

Primary Examiner—John Zazworsky
Attorney, Agent, or Firm—Cesari and McKenna

[57] ABSTRACT

A peak detector circuit particularly adapted for recovering timing and data information in a binary recording system. The circuit comprises an operational amplifier having a diode-plus-resistor bridge network in a negative feedback path from the output of the operational amplifier to its inverting input. The non-inverting input of the operational amplifier is connected to a common ground. The signal whose peak is to be detected is capacitively coupled to the op-amp's inverting input and the peak detector's output is obtained at the op-amp's output. The diode bridge network comprises two pairs of diodes connected in series and a resistor to ground from the connection node of the diode pairs; in each diode pair the two diodes are connected in parallel, back-to-back. When a peak is detected, the op-amp output switches between positive and negative saturation values. This circuit has maximum gain at the signal peaks and exhibits decreased gain (and, hence, sensitivity to noise) as the signal moves off its peak; it is fast to detect the presence of a peak and presents a fixed phase delay.

1 Claim, 10 Drawing Figures

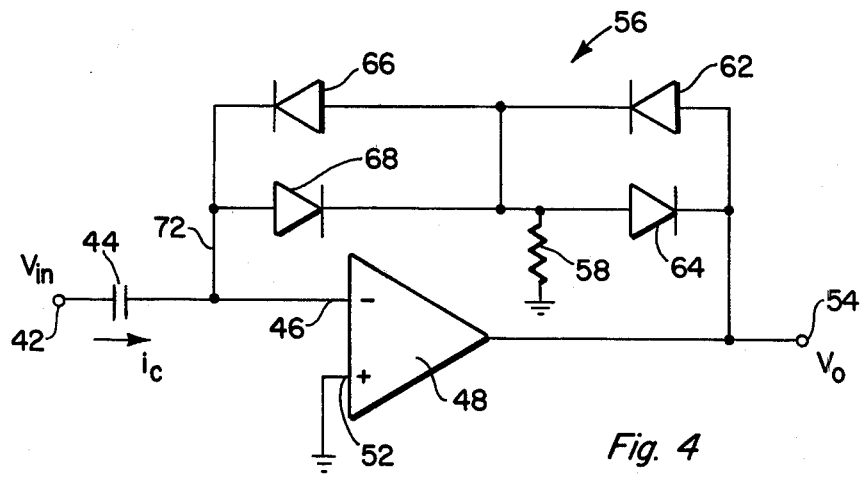
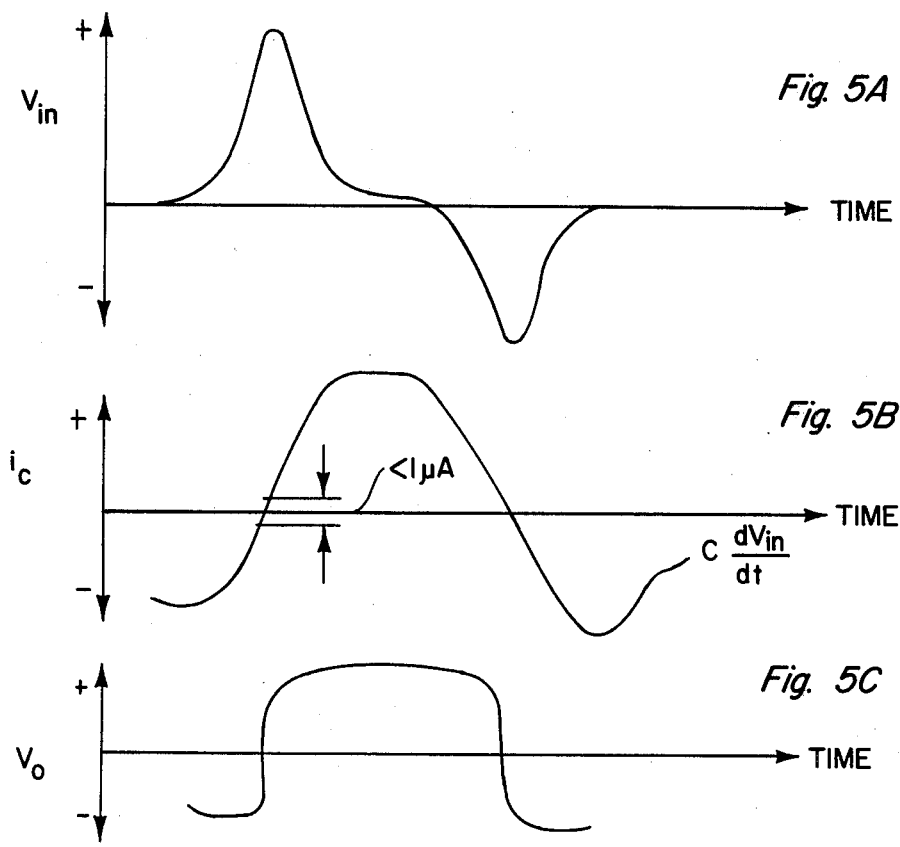

PEAK DETECTOR CIRCUIT

FIELD OF THE INVENTION

This invention relates to a circuit for peak detection of alternating current signals and, more particularly, to a peak detector for use in the reading and decoding of digital magnetic tape recordings.

BACKGROUND OF THE INVENTION

In digital data processing systems, information is frequently stored on magnetic media such as tapes and discs. The recording of digital signals on such media and their recovery is complicated by the fact that magnetic recording systems operate only upon variations in magnetic fields. These variations are a combination of both relative motion between the medium and a read/write head and time-varying signals either fed to or detected by the head. Specifically, such systems typically utilize reversals in magnetic flux patterns in order to record information. As this technique is well known in the magnetic recording and data processing industries, it is unnecessary to further elaborate here. However, it is to be noted that the significance of such technique is that the recovery of the recorded information requires the detection of AC signals and, more precisely, the detection of the peaks of such signals.

According to most, if not all, conventional recording schemes, these AC signals represent the derivatives of the recorded bit streams. Therefore, the maxima and minima (i.e., peaks) indicate the boundaries or transition points between the recorded bits. Consequently, to reconstruct the recorded signal, it is necessary to detect accurately the existence and position of such peaks. However, it is not a simple matter to detect accurately the presence and position of a peak. The design of circuits for peak detectors is complicated by the very large amplitude variations inherent in the recorded and detected signals and the inherent frequency variations involved. For example, phase encoded or "double frequency" recordings contain a two-to-one range in the frequency variations of write head current. In the presence of these conditions, the accurate recovery of data in the presence of noise (either generated by the device mechanism itself or by other sources) becomes one of the most critical and important tasks in designing any magnetic recording systems. Most common peak detector circuits suffer from problems related to sensitivity to phase shifts and noise.

OBJECTS AND SUMMARY OF THE INVENTION

Accordingly, it is an object of the present invention to provide a peak detector circuit for accurately detecting the peaks of binary signals recorded on magnetic media.

It is a further object of this invention to provide a peak detector circuit which is sensitive to a recorded signal but has decreased sensitivity to noise and a high degree of freedom from phase shift problems.

These and other, further objects of the present invention are accomplished by a peak detector circuit employing an operational amplifier together with a diode bridge network in a negative feedback loop around the amplifier. The diode bridge network effectively causes the amplifier to have a logarithmic response. The gain of this circuit is high at the signal peak and decreases as the signal moves off peak. As gain decreases, the noise sensitivity of the circuit decreases also, improving the noise resistance characteristics of the detector.

These and other features of the present invention will be more fully understood by reference to the following detailed description read in conjunction with the accompanying drawings. The invention is pointed out with particularity in the appended claims which set forth the subject matter to be secured by letters patent.

BRIEF DESCRIPTION OF THE FIGURES

FIG. 4 is a schematic circuit diagram of the peak detector of the present invention; and FIGS. 5A–5C are voltage and current waveforms illustrating the operation of the circuit of FIG. 4.

DETAILED DESCRIPTION OF AN ILLUSTRATIVE EMBODIMENT

Before proceeding into a detailed explanation of an illustrative embodiment of the invention, a brief digression to explain the nature of the recording and detection processes and the associated circuit design problems would be appropriate and helpful.

Figure 1:
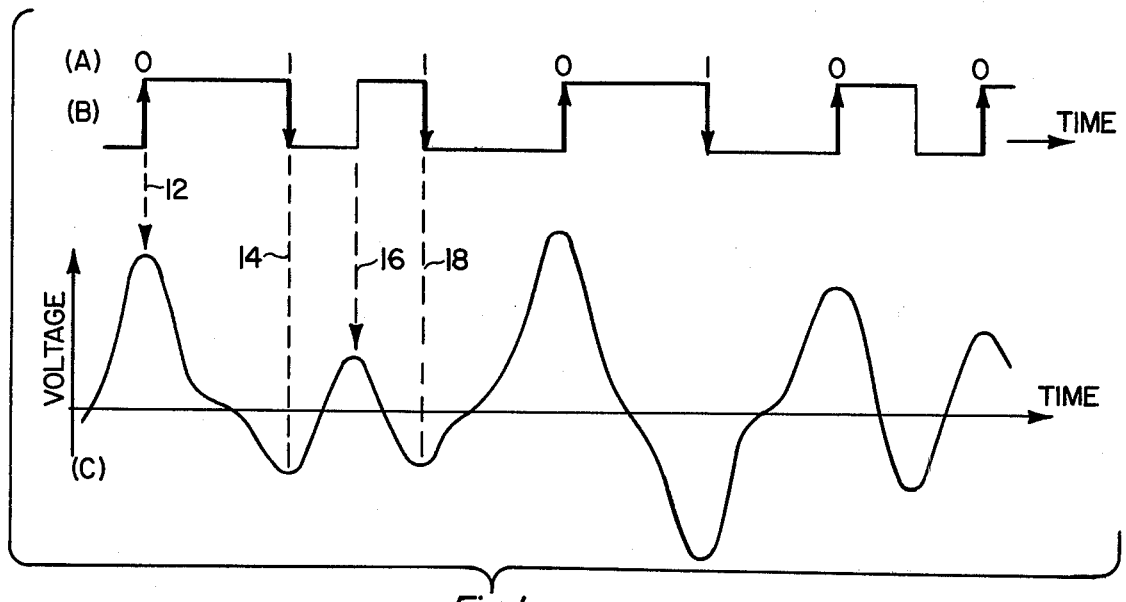
FIG. 1 is a series of curves showing a bit pattern to be recorded (A), the associated recording head write current (B), and the voltage waveform obtained on reading (C)

FIG. 1 shows a typical example of a double frequency recording of a 0110100 pattern of data bits and the corresponding waveforms at the recording head during the write operation and at the peak detector input during the read operation. Line (A) shows the binary bit pattern to be recorded. The encoded data is fed to the writing head which is driven by the recording current indicated in line (B). Upon reading the recorded data from the surface of the magnetic medium, a voltage waveform such as that indicated at line (C) is typically obtained at the output of the read head amplifier. The time scales of the waveforms on lines (B) and (C) are the same (although displaced from each other) and corresponding features are thus presented at the same horizontal position; several dashed vertical lines 12–18 have been drawn between the two waveforms to connect corresponding features thereon, in order to highlight the correspondences. At the boundaries of the data "cells," where the magnetic flux changes polarity (or direction), the amplitude of the detected voltage is greatest. This is illustrated, for example, at the points on curve (C) of FIG. 1 indicated by the lines 12 and 14. Peak detecting will accurately recover the information as to the position of the cell boundaries, and this information is necessary in order to permit the proper recovery of timing information and of the recorded data.

Typical prior art peak detectors are illustrated generally in FIGS. 2A–2D.

Figure 2A:
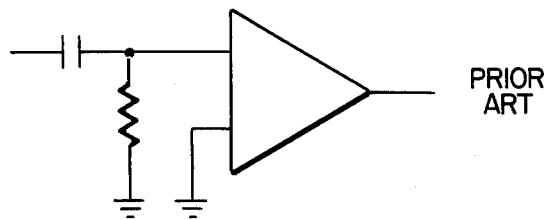
FIGS. 2A–2D are schematic circuit diagrams of prior art peak detectors.

The circuit in FIG. 2A uses a simple RC differentiator and a comparator to detect the peak through simple cross-over detection of the derivative of the input signal thereto. A change of state of the comparator output indicates a peak. Because of the inherent phase shift of the circuit, however the output of the comparator only approximately indicates the position of the peak of the input signal. Further, the phase shift of the circuit varies with frequency. And the attenuation introduced by the RC differentiator also limits circuit performance, because a large input is required to overcome this attenuation. Further, noise rejection of the circuit of FIG. 2A decreases with increasing noise frequency, as the impedance of the capacitor in the differentiator network decreases with increasing frequency.

Figure 3:
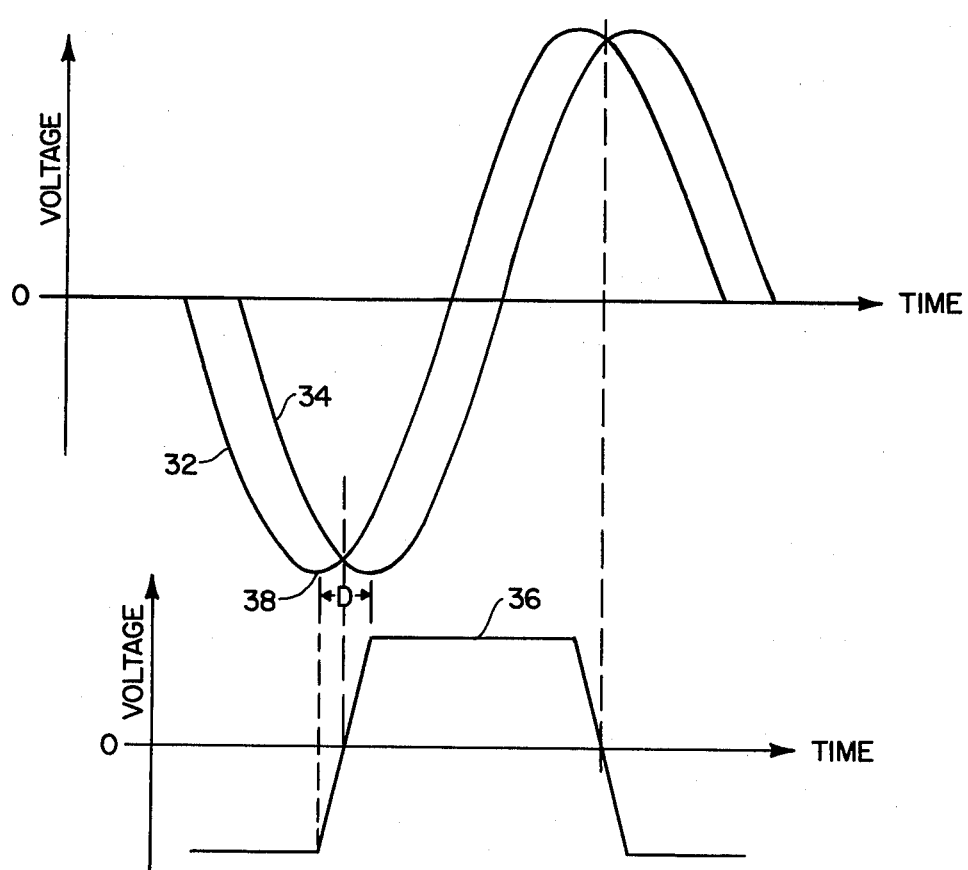
FIG. 3 is a set of waveform drawings useful in explaining the operation of the circuits of FIGS. 2B and 2C.
Figure 2B:
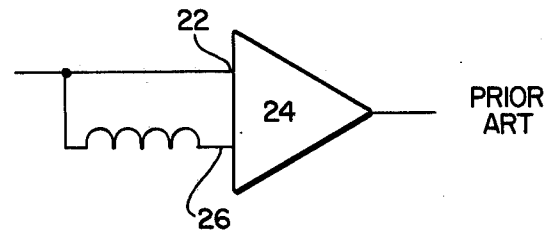
Figure 2C:
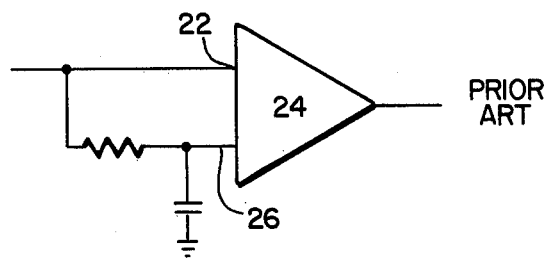

The circuits of FIGS. 2B and 2C both use a comparator to detect differences between the input signal and a delayed version of the input signal. Of course, this requires a differential comparator. The manner in which these circuits operate may be understood with reference to FIG. 3. As illustrated therein, the curve 32 represents the signal from a read head amplifier. This signal is provided to a first input terminal 22 of the differential comparator 24 in the circuit of either FIG. 2B or 2C. Correspondingly, the waveform in curve 34 is a delayed version of the waveform 32 which would appear at the other input terminal 26 of the comparator. The letter D is used to denominate the amount of time delay between the curves 32 and 34. The output of the comparator 24 is shown in curve 36 which is drawn on a separate ordinate below those curves, with the same time scale on the abscissa. As in FIG. 1, vertical dashed lines are shown to indicate time-coincident events in the waveforms.

It will readily be observed that the waveform 36 can not change states until a substantial interval after the occurence of the negative peak 38 of the waveform 32 and a change in the relative amplitude relationship between the curves 32 and 34. The actual time delay for a change of state at the comparator output depends on both the frequency and the amplitude of the detector's input signal. Further, large signal amplitudes are needed to obtain satisfactory noise immunity near the peaks; and noise on either signal near its peak could easily cause false detection of the position of the peak of the detector circuit's input waveform.

Figure 2D:
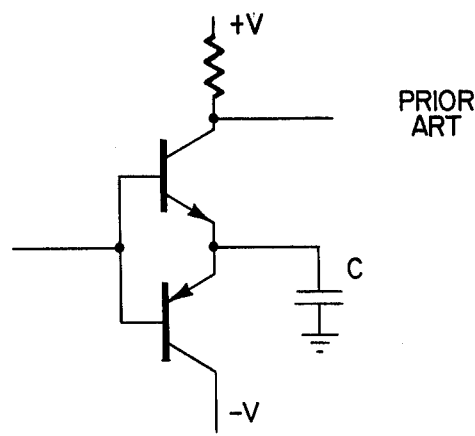

The circuit in FIG. 2D is composed of two transistors which alternately charge a capacitor, as a function of the rate of change in the input signal, and then rapidly discharge the capacitor when that rate of change goes through zero. This circuit, like those above, is deficient in many respects. It imposes a fixed delay on peak detection and it can only detect a positive peak; therefore, some rectifying must precede this circuit.

By contrast to these prior art designs, FIG. 4 shows a peak detector circuit having significantly improved performance. The input to this peak detector circuit is supplied to an input terminal 42 at one side of a coupling capacitor 44. The other side of the coupling capacitor 44 is connected to the inverting input 46 of an operational amplifier 48. The non-inverting input 52 of the operational amplifier 48 is connected to a common ground point which comprises the second terminal for both input and output. The output of the peak detector is obtained from the output of the operational amplifier, at a terminal 54. A diode and resistor bridge network 56 is connected between the operational amplifier output and its inverting input, as a feedback network. The feedback network 56 comprises a first pair of diodes 62 and 64, a second pair of diodes 66 and 68, and a resistor 58. Diodes 62 and 64 are connected back-to-back, in parallel, with the anode of one connected to the cathode of the other. One of their common leads is connected to the output terminal of the operational amplifier 48 and the other of their connections is connected to diodes 66 and 68, which are connected together in a similar fashion. The other common lead of diodes 66, 68 is connected to the inverting input of operational amplifier 48. A resistor 58 is connected between ground and the node which is common to all four diodes.

The amplified recording head signal is presented as an input voltage $V_{in}$ at terminal 42. This signal drives a current $i_c$ through capacitor 44 into the virtual ground which exists at the summing point of the amplifier inverting input 46. Thus, the voltage appearing across capacitor 44 is always (to a close approximation) equal to the voltage at terminal 42. As a result, the current $i_c$ (ideally) is proportional to the derivative of voltage $V_{in}$. If the capacitor is an ideal element, this is true at all frequencies; and it is closely approximated at frequencies of interest even with real capacitors. Hence, when the current $i_c$ goes through zero, the input signal $V_{in}$ will be at its peak.

Virtual ground analysis also assumes that no current is present into the inverting input 46 of operational amplifier 48, by virtue of its (ideally) infinite input impedance. Thus, the current in line 72 from the feedback network 56 to inverting input 46 must be equal and opposite to the capacitor current $i_c$. Consequently, when the current $i_c$ is zero, all four diodes 62-68 are in an open circuit condition and the amplifier 48 operates at its maximum open loop again, typically 60–80 db or more for common operational amplifiers. As soon as the capacitor current shifts even a fraction of a microamp away from zero, the current in line 72 must undergo an equal and opposite shift and an appropriate one of diodes 66 or 68 (according to the polarity of the change) will accordingly become forward biased and begin to conduct. When the signal current increases to about 1 microamp (assuming silicon diodes), about 400 mV appears across the conducting diode, which behaves like a logarithmic resistor. Resistor 58 supplies current into the second diode; if this is a 1000 ohm resistor, for example, 400 microamps will flow, sending the output of the amplifier promptly to its saturation level. The response time is limited only by the maximum slew rate of the operational amplifier and the charge stored in the diode. As the input signal continues to increase further, the amplifier simply behaves like a logarithmic amplifier. This continues to the point where the current saturates the diode to its bulk resistance.

Thus, the peak detector responds rapidly to the peak condition and presents a frequency-independent phase shift. This phase shift will be 90°, assuming sine wave excitation.

As the instantaneous input signal amplitude moves away from its peak value, vulnerability to noise pickup becomes increasingly significant, since the signal-to-noise ratio varies directly with the signal level when the noise level is constant. But since the gain of the amplifier decreases logarithmically with the input signal $V_{in}$, the noise susceptibility of the amplifier decreases also. In fact, a noise spike, to affect the output of the amplifier would have to be at least as large as the diode current and of opposite polarity. This characteristic gives the peak detector of FIG. 4 excellent noise immunity and permits the recording system to recover data with very good reliability.

FIGS. 5A–5C illustrate the $V_{in}$, $i_c$ and $V_o$ waveforms, respectively, as a function of time. The time axis for all three curves is the same. The scale for the ordinates should also be noted. Typically, the current $i_c$ would be in the range of 1 to 10 mA, yet the output of the operational amplifier 48 changes 100% for less than a one microamp input current deviation from zero. The resolution (in time), therefore, with which the peak detector will define the peak will be 0.0001% of the interval in which $i_c$ changes 10 mA. This resolution can be increased by the simple expediency of raising the voltage $V_{in}$ or by raising the value of capacitor 44, as the current $i_c$ is proportional to the value of the capacitance and the derivative of the input is amplitude sensitive.

To select the right operational amplifier for this peak detector, one first determines the highest fundamental frequency which will be encountered during the reading process. The open loop gain of the chosen amplifier should be flat from DC to at least that frequency and preferably should be about 60–70 db or better. Next, one determines the lowest voltage $V_{in}$ available after amplification, and the current range of the diodes to be used. The minimum current required to bias the diodes to about 400–500 mV is then established from the diode specifications. Having found that current, the minimum value for capacitor 44 can be found from the following equation:

$$C = \frac{I_c}{V_{min} w}$$

where C is the value of capacitor 44, $V_{min}$ is the minimum value of the amplitude of the input voltage, $I_c$ is the minimum current required to bias the diode and w is the highest fundamental frequency in radians per second.

In phase- (or, double-frequency) encoded recordings, the output of the double frequency signal is usually much smaller than the fundamental signal—typically 20 to 50% less. This is a condition brought about by limitations of the recording process. Advantageously, the circuit in FIG. 4 overcomes the reduced amplitude by exploiting the characteristics of the capacitor 44. Since the impedance of capacitor 44 decreases with frequency, the current i remains substantially constant between the fundamental and double frequency signals. Thus, the circuit, without any additional complexity, automatically compensates for recording losses.

Using a recording frequency of 320,000 and 160,000 pulses/sec (i.e., 1600 bpi phase encoded at 100 ips) it has been demonstrated that the circuit will detect peaks within 25 nanoseconds of their occurrence when the signal amplitude is varied over a range of 100-to-1.

While a specific exemplary embodiment of the circuit has been illustrated herein, it is understood and expected that variations thereon and improvements and modifications thereto will readily occur to those skilled in the art; accordingly, such variations, improvements and modifications are intended to be within the spirit of the invention and are (directly or indirectly) of this disclosure. Thus, the invention is intended to be limited only as defined in the following claims.

What is claimed as new and desired to be secured by Letters Patent of the United States is:

1. A circuit for detecting the maxima and minima of an input voltage waveform comprising:

two-terminal input and output ports;

a first terminal of each port being connected to the first terminal of the other port to establish a common reference point;

a capacitor having first and second leads;

the second terminal of the input port being connected to a first lead of the capacitor;

an operational amplifier having inverting and non-inverting inputs and an output;

the second lead of the capacitor being connected to the inverting input of the operational amplifier;

the non-inverting input of the operatinal amplifier being connected to the common reference point; and a diode-resistor bridge network connected between the output and the inverting input of the operational amplifier, said network comprising:

a first diode whose anode is connected to the output of the operational amplifier, a second diode whose cathode is connected to the output of the operational amplifier, a third diode whose anode is connected to the inverting input of the operational amplifier, a fourth diode whose cathode is connected to the inverting input of the operational amplifier, the cathodes of the first and third diode and the anodes of the second and fourth diodes being connected together at a common node, and a resistor being connected between said common node and ground.

* * * * *